US012641874B2

(12) United States Patent
Kang et al.

(10) Patent No.: US 12,641,874 B2
(45) Date of Patent: May 26, 2026

(54) SPACER PROTECTING SEMICONDUCTOR SUBSTRATE UNDER PASSIVE DEVICE DURING BACKSIDE CONTACT FORMATION

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 349 days.

(21) Appl. No.: 18/471,778

(22) Filed: Sep. 21, 2023

(65) Prior Publication Data

US 2025/0107227 A1      Mar. 27, 2025

(51) Int. Cl.
| | |
|---|---|
| *H10D 84/85* | (2025.01) |
| *H10D 30/01* | (2025.01) |
| *H10D 30/62* | (2025.01) |
| *H10D 30/67* | (2025.01) |
| *H10D 62/13* | (2025.01) |
| *H10D 84/01* | (2025.01) |
| *H10D 84/03* | (2025.01) |
| *H10D 84/83* | (2025.01) |
| *H10B 80/00* | (2023.01) |

(52) U.S. Cl.
CPC ......... *H10D 84/853* (2025.01); *H10D 30/024* (2025.01); *H10D 30/62* (2025.01); *H10D 30/6735* (2025.01); *H10D 62/154* (2025.01); *H10D 62/158* (2025.01); *H10D 84/0151* (2025.01); *H10D 84/0158* (2025.01); *H10D 84/038* (2025.01); *H10D 84/834* (2025.01); *H10B 80/00* (2023.02)

(58) Field of Classification Search
CPC .... H10D 84/853; H10D 30/024; H10D 30/62; H10D 30/6735; H10D 62/154; H10D 62/158; H10D 84/0151; H10D 84/0158; H10D 84/038; H10D 84/834; H10D 84/401; H10D 84/832; H10D 30/0198; H10D 30/501; H10D 84/811; H10D 84/0149; H10D 84/83; H10D 30/6757; H10B 80/00; B82Y 10/00
See application file for complete search history.

(56) References Cited

U.S. PATENT DOCUMENTS

| | | |
|---|---|---|
| 8,901,663 B2 | 12/2014 | Choi |
| 9,147,598 B2 | 9/2015 | Huang |
| 9,704,855 B2 | 7/2017 | Xu |
| 10,199,372 B2 | 2/2019 | Muri |

(Continued)

*Primary Examiner* — Yasser A Abdelaziez
(74) *Attorney, Agent, or Firm* — Gavin Giraud

(57) ABSTRACT

A semiconductor structure provides a spacer directly contacting a sidewall of portion of a hardmask material, a sidewall of a portion of a backside interlayer dielectric material, and a sidewall of a portion of a semiconductor substrate on the portion of a hardmask material. The spacer resides directly below and contacts a liner of a shallow trench isolation that is between a passive device region and an active device region. The spacer prevents undercutting of the semiconductor substrate in the protected region between the active device region and the passive device region during backside contact formation.

13 Claims, 11 Drawing Sheets

(56)                References Cited

U.S. PATENT DOCUMENTS

| | | |
|---|---|---|
| 10,872,820 B2 | 12/2020 | Block |
| 12,243,913 B2 | 3/2025 | Jain et al. |
| 2021/0358850 A1 | 11/2021 | Chen |
| 2021/0375856 A1 | 12/2021 | Alcorn |
| 2022/0384574 A1* | 12/2022 | Frougier ............. H10D 84/038 |
| 2022/0415880 A1 | 12/2022 | Kar |
| 2023/0013764 A1 | 1/2023 | Chou |
| 2023/0095421 A1 | 3/2023 | Byounghak |
| 2023/0215767 A1* | 7/2023 | Xie ..................... H10D 64/017 257/329 |
| 2023/0268389 A1 | 8/2023 | Nikhil |

* cited by examiner

SPACER PROTECTING SEMICONDUCTOR SUBSTRATE UNDER PASSIVE DEVICE DURING BACKSIDE CONTACT FORMATION

BACKGROUND

The disclosure relates generally to semiconductor device manufacturing. The disclosure relates particularly to forming a protective spacer between logic and passive device regions to reduce the undercut of the semiconductor substrate under passive devices in semiconductor chips with a backside power delivery network (BSPDN).

The amount of data we process is rapidly increasing at a rate higher than that of Moore's law. Increasing system performance requirements, driven at least in part by the increasing use of artificial intelligence, continue to drive tighter pitches in semiconductor devices and smaller semiconductor chips. For logic scaling at the two-nanometer node, planar and non-planar semiconductor device structures, such as metal-oxide-semiconductor field-effect transistors (MOSFETs), must be scaled to smaller dimensions. As the semiconductor industry continues into the two-nanometer technology node with tighter pitches and increasing performance requirements, increased use of backside interconnect layers for a backside power delivery network is emerging. Creating backside interconnect layers below the front-end-of-line semiconductor devices provides improved power performance and more routing options for semiconductor devices relieving some of the BEOL wiring congestion. As semiconductor device pitches and dimensions shrink and backside BEOL interconnect wiring for backside power delivery networks are formed, new device design and semiconductor process ground rules will emerge.

SUMMARY

The following presents a summary to provide a basic understanding of one or more embodiments of the disclosure. This summary is not intended to identify critical elements or delineate any scope of the particular embodiments or any scope of the claims. Its sole purpose is to present concepts in a simplified form as a prelude to the more detailed description that is presented later.

Aspects of the disclosed invention relate to a spacer directly contacting a portion of a hardmask material, a portion of a backside interlayer dielectric material, and a portion of a semiconductor substrate on the portion of a hardmask material. The spacer resides directly below and contacts a liner of a shallow trench isolation that is between a passive device region and an active device region.

Aspects of the present invention provide a method of forming a semiconductor structure with the spacer under a shallow isolation trench that is between an active device region and a passive device region of a semiconductor structure. The method includes bonding a carrier wafer to a frontside interconnect wiring. The frontside interconnect wiring connects to a passive device in a passive device region and to one or more source/drains of one or more active devices. The method includes removing the semiconductor substrate on an etch stop layer and then, removing the etch stop layer on a semiconductor substrate. The method includes depositing the hardmask material on the semiconductor substrate and then, patterning an optical polymer layer (OPL) on the hardmask material. The method includes etching the top surface of exposed s portions of the semiconductor substrate. The method includes forming a spacer on the exposed sidewalls of the semiconductor substrate, the hardmask material, and the OPL. The method includes depositing a backside interlayer dielectric. The method includes forming backside contacts to the source/drains and the passive devices. The method includes forming a backside power rail contacting the hardmask material, the spacer, the backside interlayer dielectric, and each of the backside contacts, and then, forming a backside power delivery network on the backside power rail.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
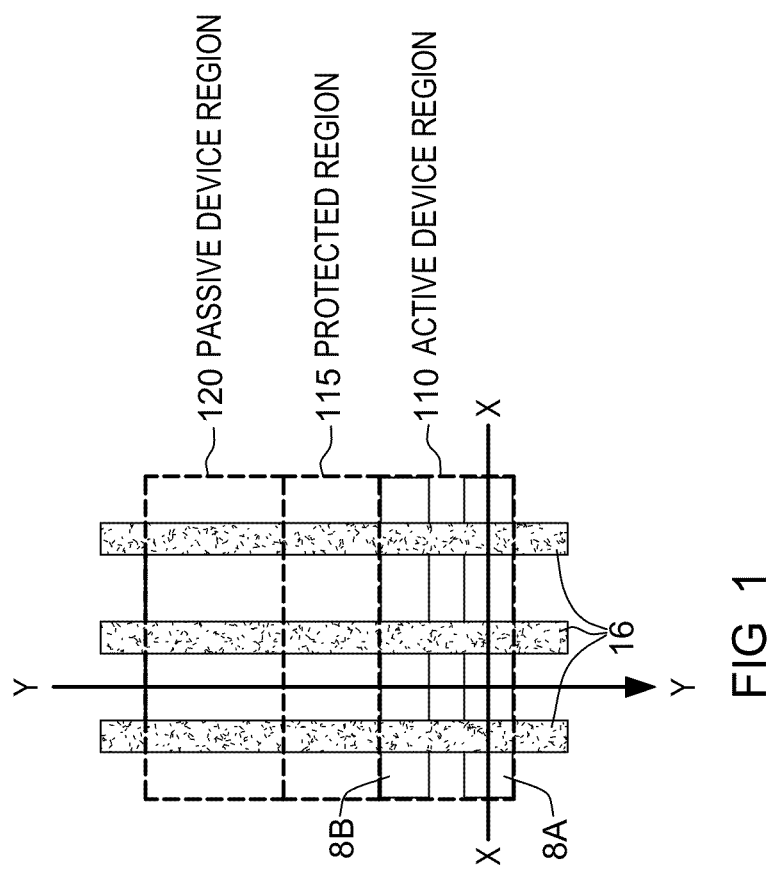
FIG. 1 depicts an example of a top view of a design schematic illustration of a semiconductor chip with a passive device region and a logic device region, in accordance with an embodiment of the present invention.

Embodiments of the present invention recognize that as system and device performance increases and the device feature size continues to reduce, a backside power delivery network (BSPDN) can be provided for high-performance applications. With the increasing system and device performance and smaller device feature sizes along with the utilization of a BSPDN, the co-integration of passive devices and logic devices may be required. The complete removal of the semiconductor substrate occurs in the logic or active device region to form the backside power delivery network. Portions of the substrate are needed in the passive device region for the passive device wells. Embodiments of the present invention recognize that protection of portions of the substrate for the passive device wells in the passive device region is needed. The continued effort to shrink the semiconductor chip size makes providing a large isolation area to protect the passive device well of the semiconductor substrate undesirable.

Aspects of the present invention provide a spacer located between the passive device and the logic device region. The spacer is directly abutting a portion of the semiconductor substrate under a shallow isolation trench in a protected region between the active devices and the passive devices. The spacer prevents undercutting of the semiconductor substrate in the protected region adjacent to the passive device region. Specifically, the spacer prevents undercutting or etching of the semiconductor substrate that contacts the well of the passive device during backside contact formation. In this way, the spacer can protects the portion of the semiconductor substrate that is the passive device well during backside contact formation. The well of the passive device is a doped portion of the semiconductor substrate in the passive device region.

In embodiments, the spacer directly contacts a sidewall of the semiconductor substrate material under the shallow trench isolation (STI) in the protected region, a sidewall of a hardmask material directly under the semiconductor substrate, and a sidewall of a backside dielectric hardmask material. The spacer also contacts a liner surrounding the STI directly above the spacer. The spacer prevents the removal of the portion of the semiconductor substrate material under the STI in the protected region. By protecting the semiconductor material, the spacer also protects the well of the passive device where the well of the passive device is a doped portion of the semiconductor substrate. Preventing the undercutting of the semiconductor substrate material in the protected region during semiconductor substrate etching for backside contact formation in the active device region improves the performance of the completed semiconductor chip by maintaining the integrity of the well of the passive device.

In embodiments, the spacer is between the passive device closest to the active device region and an active device (e.g., logic or memory device) in the active device region closest to the passive device. The spacer resides in the region also known as a protected or forbidden area between the passive devices and the active devices. In embodiments, the protected region in an area that is typically provided between adjacent active and passive devices to prevent semiconductor undercut during backside contact formation in semiconductor structures with a backside power rail and/or a BSPDN.

Providing the spacer directly abutting the semiconductor substrate under the shallow trench isolation in protected region that contacts the well of the passive device(s) closest to an active device in the active device region may allow a reduction in the space needed to prevent passive device well undercutting. In embodiments, the spacer directly abuts the well of the passive device closest to the active device region. The spacer may reduce the width of the protected region by reducing the distance needed between adjacent active devices and passive devices to prevent undercutting of the passive device well during backside contact formation in semiconductor chips utilizing a BSPDN. In this way, providing the spacer abutting the doped semiconductor substrate under the passive device(s) may allow a smaller semiconductor chip footprint.

The hardmask remains under the portion of the semiconductor under the shallow isolation trench in a protected region and under the passive device well after forming the backside contacts. The hardmask provides electrical isolation from the backside power rail. The backside power rail contacts the hardmask, the spacer, the backside contacts, and the backside interlayer dielectric in the protected region and the active device region. The hardmask also directly abuts the spacer. The BSPDN is formed on the backside power rail using known back-end-of line (BEOL) semiconductor manufacturing processes. At least one of the backside contacts electrically connects with the BSPDN.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

Detailed embodiments of the claimed structures and methods are disclosed herein. The method described below does not form a complete process flow for manufacturing integrated circuits, such as semiconductor devices. The present embodiments can be practiced in conjunction with the integrated circuit fabrication techniques currently used in the art, for semiconductor devices, and only so much of the commonly practiced process steps are included as are necessary for an understanding of the described embodiments. The figures are not drawn to scale but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

Reference is now made to the figures. The figures provide schematic cross-sectional illustrations of semiconductor devices at intermediate stages of fabrication, according to one or more embodiments of the invention. The device provides schematic representations of the devices of the invention and is not to be considered accurate or limiting with regard to device element scale.

FIG. 1 depicts an example of a top view of a design schematic illustration of a semiconductor chip with passive device region 120, protected region 115, and active device region 110, in accordance with an embodiment of the present invention. As depicted, FIG. 1 includes source/drain epi 8A, source/drain epi 8B, and gate 16 in active device region 110, an illustration of protected region 115 without active or passive devices, and passive device region 120. Also, illustrated are the locations of the X-X cross-sections and Y-Y cross-sections illustrated in FIGS. 2-11. As depicted in FIG. 1, the location of the cross-sectional view X-X is across gates 16 in active device region 110, and the location of the cross-sectional view Y-Y is parallel and between gates 16. The location of the cross-sections X-X and the cross-section Y-Y are in the same locations for FIGS. 2-11.

In other examples, one or more of the size of active device region 110, the shape of active device region 110, the number and the type of devices in active device region 110 is different. Similarly, in other embodiments, the size of passive device region 120, the shape of passive device region 120, the number and type of devices in passive devices in passive device region 120 are different. In other examples, the size and shape of protected region 115 is different. FIG. 1 is a top view of one design device schematic for illustration purposes.

Figure 2:
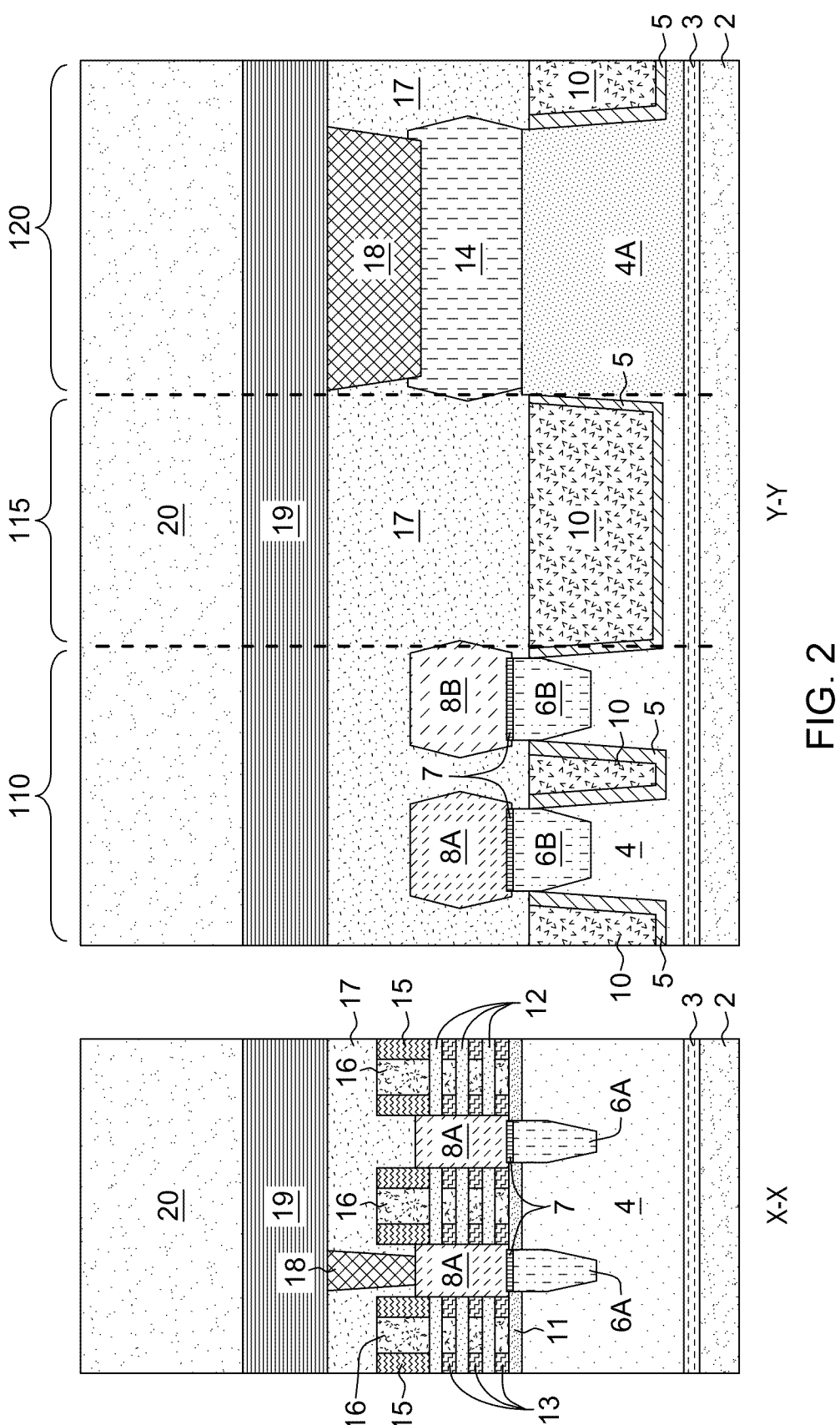
FIG. 2 depicts a cross-sectional view of a semiconductor structure with a device region, a protected region, and a passive device region, in accordance with an embodiment of the present invention.

FIG. 2 depicts cross-sectional views of a semiconductor structure with active device region 110, protected region 115, and passive device region 120, in accordance with an embodiment of the present invention. As depicted, FIG. 2 includes an illustration of the semiconductor structure in the cross-sectional view X-X and the cross-sectional view Y-Y. As depicted in FIG. 2, protected region 115 includes a pre-cursor semiconductor structure with STI 10, liner 5, a portion of each of frontside interconnect wiring 19, ILD 17, semiconductor 4, etch stop 3, and substrate 2.

In cross-sectional view X-X, FIG. 2 includes substrate 2, etch stop 3, semiconductor 4, placeholders 6A, buffer 7, source/drain epi 8A, bottom dielectric insulator (BDI) 11, channels 12, inner spacers 13, gate spacer 15, gate 16, ILD 17, contact 18, frontside interconnect wiring 19, and carrier wafer 20.

Substrate 2 may be composed of any known semiconductor material for a semiconductor substrate or wafer used in semiconductor chip manufacture. In various embodiments, substrate 2 is silicon. Etch stop 3 is directly on substrate 2.

In various embodiments, etch stop 3 is composed of silicon-germanium but is not limited to this material. In other embodiments, etch stop 3 is composed of any etch stop material used in semiconductor device manufacture. Semiconductor 4 resides on etch stop 3 and may be composed of any semiconductor material. In various embodiments, semiconductor 4 is silicon but is not limited to this semiconductor material. In various embodiments, semiconductor 4 is a semiconductor material for a semiconductor substrate that is capable of being selectively doped with an n-type dopant or a p-type dopant. Semiconductor 4 may be doped or undoped.

Placeholders 6A reside in semiconductor 4 directly under buffer 7. Placeholders 6A can be any type of semiconductor material with a different etch selectivity than semiconductor 4 and buffer 7. In various embodiments, placeholders 6A are composed of silicon-germanium but are not limited to this material. Buffer 7 is a thin layer of a semiconductor material protecting source/drain epi 8A during later etching processes. Buffer 7 may be epitaxially grown on placeholder 6A. Buffer 7 is composed of a semiconductor material with a different etch selectivity than placeholders 6A or placeholders 6B (depicted in the cross-sectional view Y-Y of FIG. 2). In various embodiments, buffer 7 is composed of silicon.

In various embodiments, source/drain epi 8A in cross-sectionally view X-X is a source/drain of the nanosheet gate-all-around field-effect transistor (GAA FET) formed by channels 12 with inner spacers 13, gate 16, gate spacer 15, and source/drain epi 8A. Source/drain epi 8A can be grown by epitaxy on buffer 7. Source/drain epi 8A can be doped or undoped. In various embodiments, source/drain epi 8A is doped.

Source/drain epi 8A can be composed of any suitable semiconductor material used in nanosheet GAA FETs. For example, source/drain epi 8A can be a doped silicon-germanium (SiGe). In various embodiments, epi 8A is composed of a boron-doped SiGe for a p-type dopant in the source/drain. In other embodiments, source/drain epi 8A is a phosphorus-doped semiconductor material for an n-type dopant.

Channels 12 can be composed of any known semiconductor material for nanosheet GAA FETS. For example, channels 12 may be composed of silicon. Inner spacers 13, gate spacer 15, and BDI 11 may be formed with any suitable dielectric material while gate 16 can be any material or combination of materials commonly used in gates or gate structures for semiconductor devices such as a nanosheet GAA FET. ILD 17 can be any dielectric material such as $SiO_2$. Contact 18 may be composed of any contact metal or contact metal alloy (e.g., Cu). Frontside interconnect wiring 19 is formed using known backend-of-line (BEOL) semiconductor manufacturing processes and, as known to one skilled in the art, is composed of multiple layers of metal and dielectric materials forming portions of metal layers, conductive metal lines, and vias. Carrier wafer 20 can be directly bonded to frontside interconnect wiring 19 with known wafer bonding processes. Carrier wafer 20 can be composed of any type of carrier wafer material (e.g., Si).

In cross-sectional view Y-Y, FIG. 2 includes substrate 2, etch stop 3, semiconductor 4, placeholders 6B, buffer 7, source/drain epi 8A, source/drain epi 8B, passive device 14 with a well composed of semiconductor 4A, shallow trench isolation (STI) 10 with liner 5, ILD 17, frontside interconnect wiring 19, and carrier wafer 20. As depicted, FIG. 2 also includes (1) active device region 110 with source/drain epi 8A and source/drain epi 8B which are the source/drains of the nanosheet GAA FETs, (2) protected region 115 with STI 10, portions of each of carrier wafer 20, frontside interconnect wiring 19, ILD 17, semiconductor 4 over etch stop 3, and substrate 2 and (3) passive region 120 including passive device 14 with semiconductor 4A as a passive device well, contact 18, and portions of each of carrier wafer 20, frontside interconnect wiring 19, ILD 17, STI 10, etch stop 3, and substrate 2.

In various embodiments, semiconductor 4A is a portion of semiconductor 4 after doping the portion of semiconductor 4 as a well of passive device 14. Semiconductor 4A is a doped portion of semiconductor 4. In various embodiments, semiconductor 4A is a doped well (e.g., an n-well or a p-well) of passive device 14. Semiconductor 4A (i.e., the well of passive device 14) is directly under the epitaxy labeled as passive device 14 in passive device region 120. In various embodiments, semiconductor 4A is a well of passive device 14 which is doped with an n-type dopant to form a n-well or with a p-type dopant to form a p-well of passive device 14. In FIG. 2, semiconductor 4A and the epi labeled 14 compose passive device 14.

In embodiments, semiconductor 4 and semiconductor 4A are composed of the same semiconductor material with different doping. In some embodiments, semiconductor 4A is doped with a p-type dopant for a p-well, and semiconductor 4 is doped with an n-type dopant. In other embodiments, semiconductor 4A is doped with an n-type dopant for an n-well and semiconductor 4 with a p-type dopant. In other embodiments, the portion of semiconductor 4 under STI 10 in protected region 115 is doped with the same dopant as semiconductor 4A. The portion of semiconductor 4 under STI 10 in protected region 115 is one of undoped or doped. In some embodiments, semiconductor 4A is the same semiconductor material with the same doping as semiconductor 4.

The sidewalls and bottom surfaces of STI 10 adjacent to semiconductor 4 and semiconductor 4A, are surrounded by liner 5. Liner 5 is composed of any dielectric material used as a STI liner. Semiconductor 4A and semiconductor 4 reside above and contact etch stop 3.

Passive device 14 can be any type of passive device. For example, passive device 14 can be a diode, an electrostatic discharge (ESD) diode, a bipolar transistor, or other passive device. In various embodiments, passive device 14 is composed of semiconductor 4A as an n-well and a boron-doped SiGe material that is epitaxially grown and labeled passive device 14 in FIG. 2. In other embodiments, passive device 14 has a different structure and is composed of different materials. As known to one skilled in the art, more than one passive device can reside in passive device region 120, and one or more types of passive devices can reside in passive device region 120.

In some embodiments, placeholders 6B can be composed of the same material as placeholders 6A (depicted in the cross-sectional view X-X). For example, placeholders 6B and placeholders 6A are composed of a semiconductor material such as SiGe with a different etch selectivity than buffer 7, semiconductor 4, and semiconductor 4A. In some cases, placeholders 6A and 6B may be composed of different materials or different semiconductor materials.

As depicted in cross-sectional view Y-Y of FIG. 2, source/drain epi 8A is to the left of source/drain epi 8B where source/drain epi 8A and source/drain epi 8B are source/drains in the logic devices of active device region 110. As depicted, source/drain epi 8A has a different doping material than source/drain epi 8B. In various embodiments, source/drain epi 8A is p-doped and source/drain epi 8B is n-doped. In other embodiments, the doping of source/drain epi 8A and source/drain epi 8B is reversed (e.g., source/drain epi 8A is n-doped and source/drain epi 8B is p-doped). For example, n-type doping materials may include but are not limited to phosphorous, arsenic, or antimony while p-type doping materials include boron and indium. In some cases, source/drain epi 8A and/or 8B may be undoped. As known to one skilled in the art, the location and type of doping material for source/drain epi 8A and source/drain epi 8B may vary depending on the type of logic device formed in active device region 110.

Figure 11:
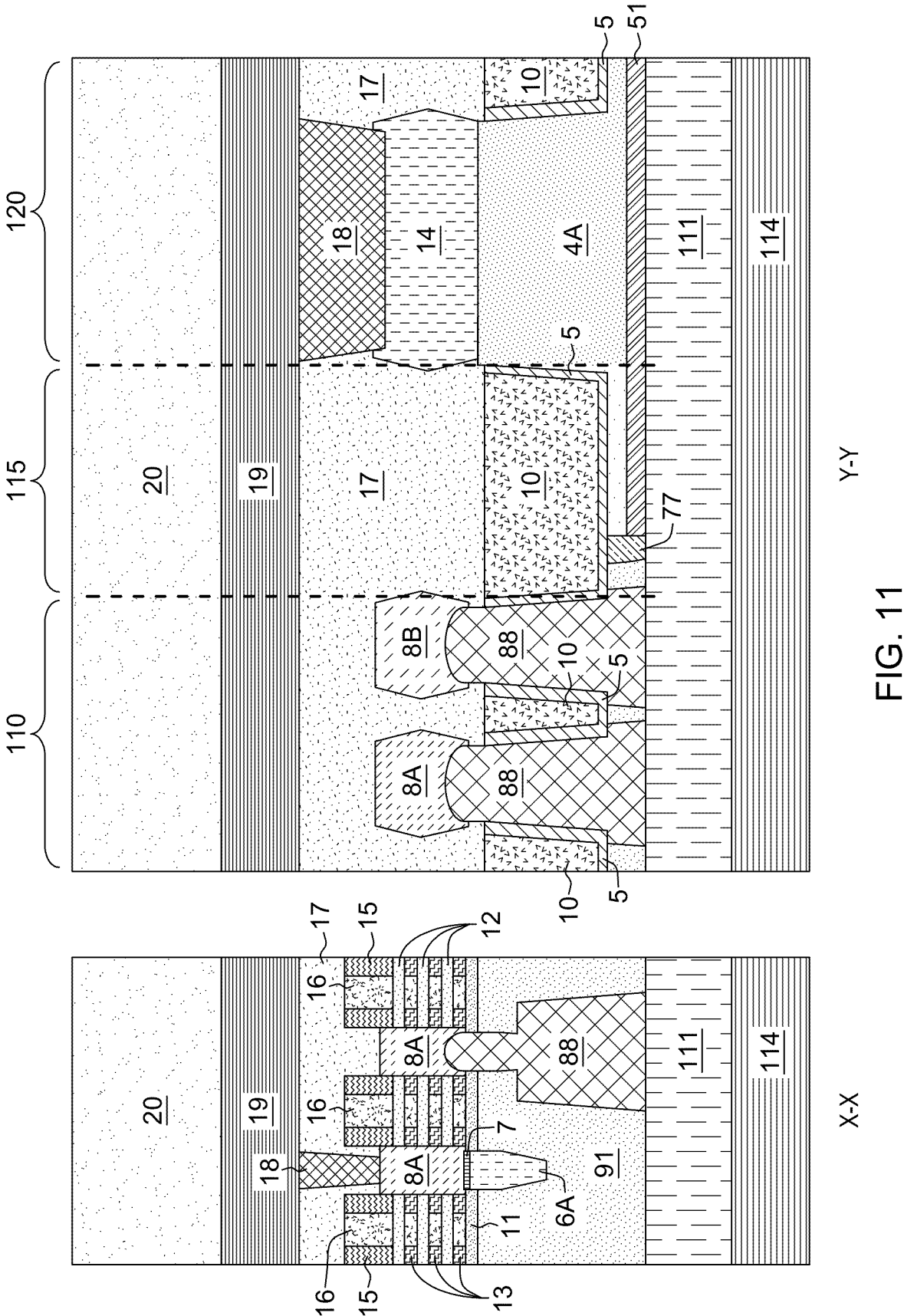
FIG. 11 depicts a cross-sectional view of the semiconductor structure after depositing a backside power rail (BPR) and forming backside interconnect wiring for a backside power delivery network (BSPDN), in accordance with an embodiment of the present invention.

While cross-sectional views X-X and Y-Y depict the pre-cursor semiconductor structures for forming the nanosheet GAA FETs of FIG. 11 in active device region 110, in other embodiments, the active devices in active device region 110 can be any type of logic device or memory device formed with a BSPDN. For example, the devices formed in active device region include one or more non-volatile memory (NVM) devices such as NOR flash memory devices and NAND flash memory devices, static random-access (SRAM) devices, finFET devices, complementary FET devices (CFETs), or a combination of these device but are not limited to these types of active devices.

Figure 3:
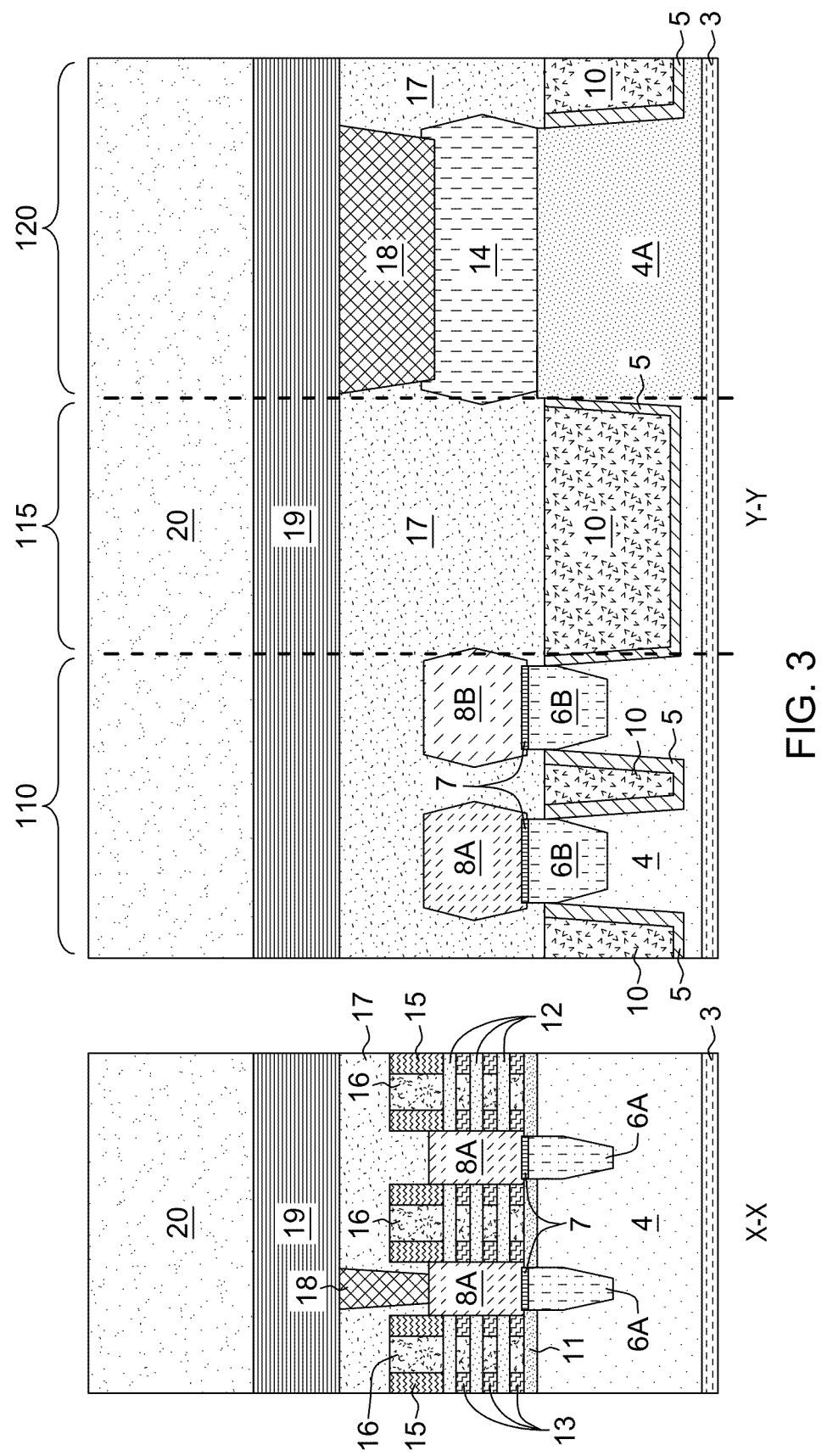
FIG. 3 depicts a cross-sectional view of the semiconductor structure after removing a semiconductor substrate, in accordance with an embodiment of the present invention.

FIG. 3 depicts cross-sectional views of the semiconductor structure after removing substrate 2, in accordance with an embodiment of the present invention. As depicted, cross-sectional view X-X and cross-sectional view Y-Y of FIG. 3 includes the same elements as the cross-sectional view X-X and cross-sectional view Y-Y of FIG. 2 without substrate 2. Substrate 2 can be removed to expose etch stop 3 using known wafer grinding processes and/or a known wet or dry semiconductor etching process.

Figure 4:
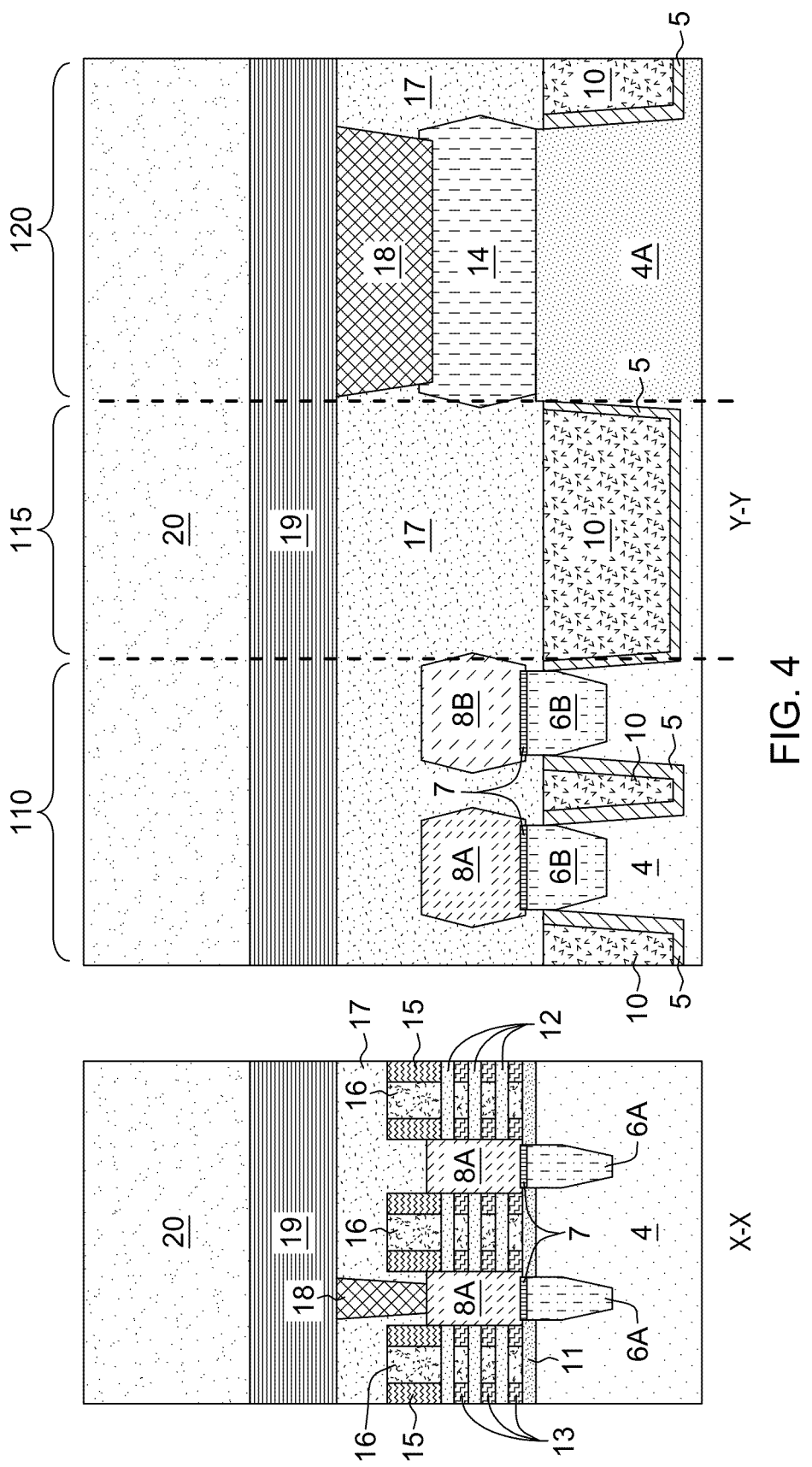
FIG. 4 depicts a cross-sectional view of the semiconductor structure after removing an etch stop layer, in accordance with an embodiment of the present invention.

FIG. 4 depicts cross-sectional views of the semiconductor structure after removing etch stop 3, in accordance with an embodiment of the present invention. As depicted, cross-sectional view X-X and cross-sectional view Y-Y of FIG. 4 include the same elements as the cross-sectional view X-X and cross-sectional view Y-Y of FIG. 3 without etch stop 3. Etch stop 3 may be removed using one or more known wet or dry semiconductor material etching processes. After removing etch stop 3, bottom surfaces of semiconductor 4 and semiconductor 4A are exposed.

Figure 5:
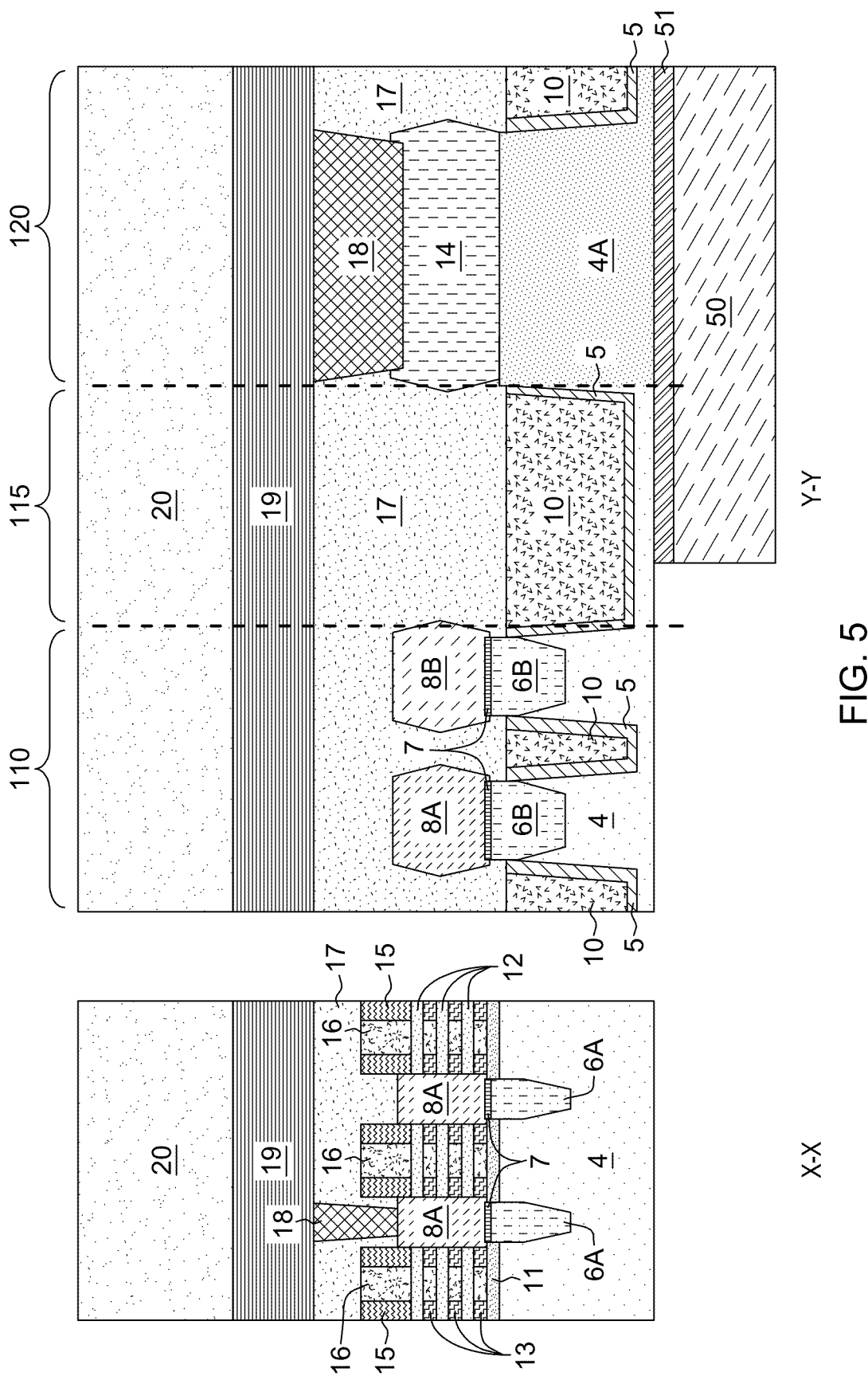
FIG. 5 depicts a cross-sectional view of the semiconductor structure after depositing and patterning a hardmask using an optical polymer layer (OPL), in accordance with an embodiment of the present invention.

FIG. 5 depicts cross-sectional views of the semiconductor structure after depositing and patterning hardmask 51 using OPL 50, in accordance with an embodiment of the present invention. As depicted, cross-sectional view X-X and cross-sectional view Y-Y of FIG. 5 includes the same elements as the cross-sectional view X-X and cross-sectional view Y-Y of FIG. 4 with portions of hardmask 51 and OPL 50 over a portion of semiconductor 4 in a portion of protected region 115 and over semiconductor 4A in passive device region 120.

A layer of dielectric material for hardmask 51 is deposited over semiconductor 4 semiconductor 4A. Hardmask 51 can be composed of any suitable dielectric material for a hardmask such as but not limited to $SiO_2$, SiCN, or other similar dielectric materials. A layer of OPL 50 is deposited over hardmask 51. Using known lithography processes and etching processes, a portion of OPL 50 and hardmask 51 are removed in cross-sectional view Y-Y of FIG. 5 under active device region 110 and under an adjacent portion of protected region 115. Hardmask 51 and OPL 50 remain under passive device region 120 and under a right-side portion of protected region 115 adjacent to passive device region 120.

Figure 6:
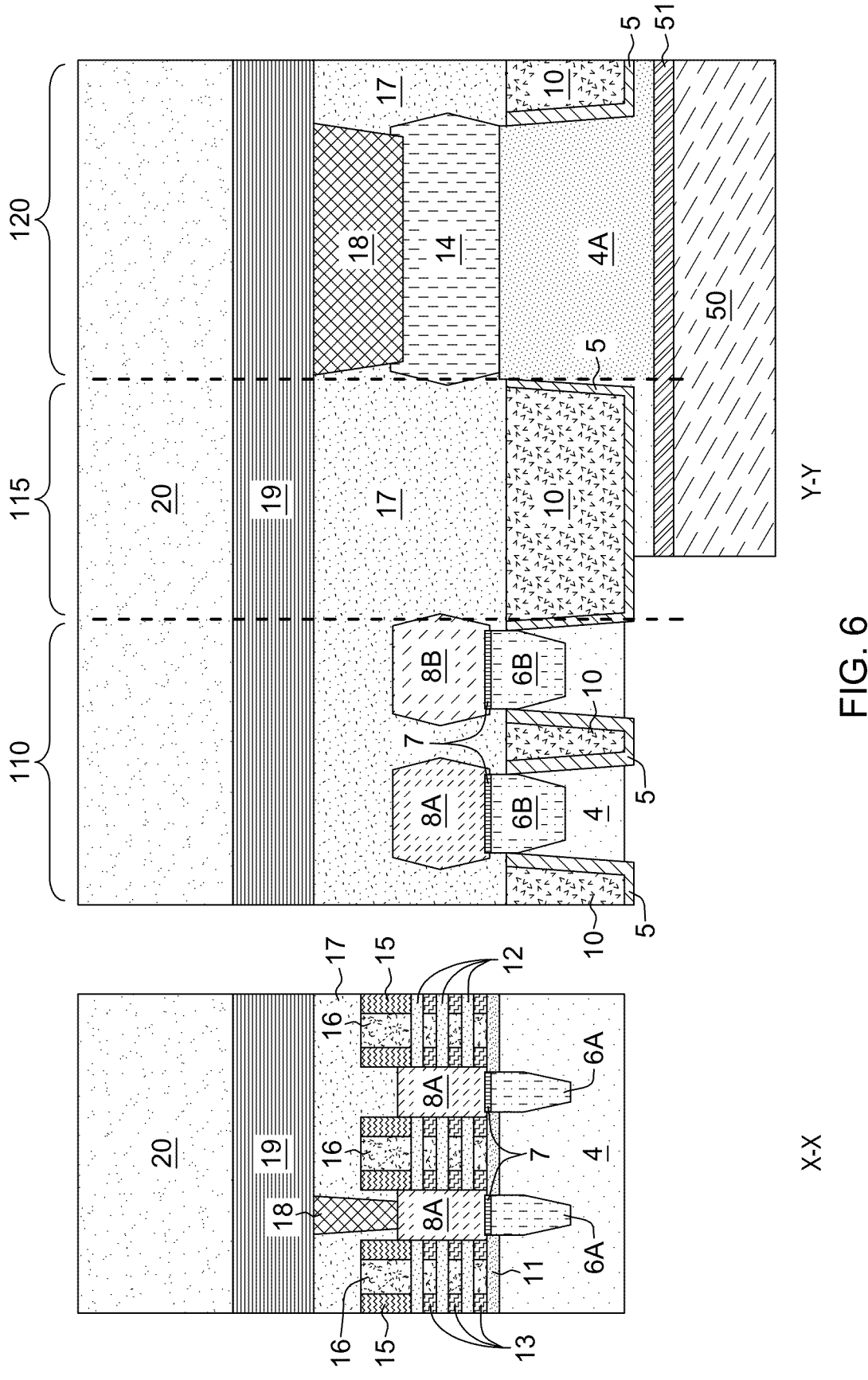
FIG. 6 depicts a cross-sectional view of the semiconductor structure after recessing a portion of a silicon layer in the logic device region and in a portion of the protected region, in accordance with an embodiment of the present invention.

FIG. 6 depicts cross-sectional views of the semiconductor structure after recessing exposed portions of a semiconductor 4 under active device region 110 and under a portion of protected region 115 adjacent to passive device region 120, in accordance with an embodiment of the present invention.

As depicted, cross-sectional view X-X and cross-sectional view Y-Y of FIG. 6 includes the same elements as the cross-sectional view X-X and cross-sectional view Y-Y of FIG. 5 without exposed portions of semiconductor 4 that are not covered by hardmask 51 and OPL 50.

As depicted in cross-sectional view Y-Y of FIG. 6, recessing of the exposed portions of semiconductor 4 below active device region 110 and under a leftmost portion of protected region 115 adjacent to passive device region 120 occurs. For example, using one or more known wet and/or dry semiconductor material etching processes, exposed surfaces of semiconductor 4 are recessed. The top portion of the surfaces of semiconductor 4 can be removed to a level that is below or approximately equal to liner 5 around STIs 10. After etching semiconductor 4, horizontal bottom surfaces of some STIs 10 and, in some cases, a portion of the sidewalls of liner 5 are exposed in active device region 110 and in the adjacent portion of protected region 115. Semiconductor 4A under hardmask 51 in passive device region 120 and the portion of semiconductor 4 under hardmask 51 in protected region 115 and in passive device region 110 are not recessed. In an embodiment, hardmask 51 and OPL 50 cover semiconductor 4A, and after recessing semiconductor 4 in active region 110 and in portions of passive region 115, semiconductor 4A remains under hardmask 51 in passive device region 110 and in a small rightmost portion of protected region 115.

As depicted, semiconductor 4 is recessed in the cross-sectional view X-X. Portions of semiconductor 4 under source/drain epi 8A and source/drain epi 8B remain after semiconductor 4 recessing.

Figure 7:
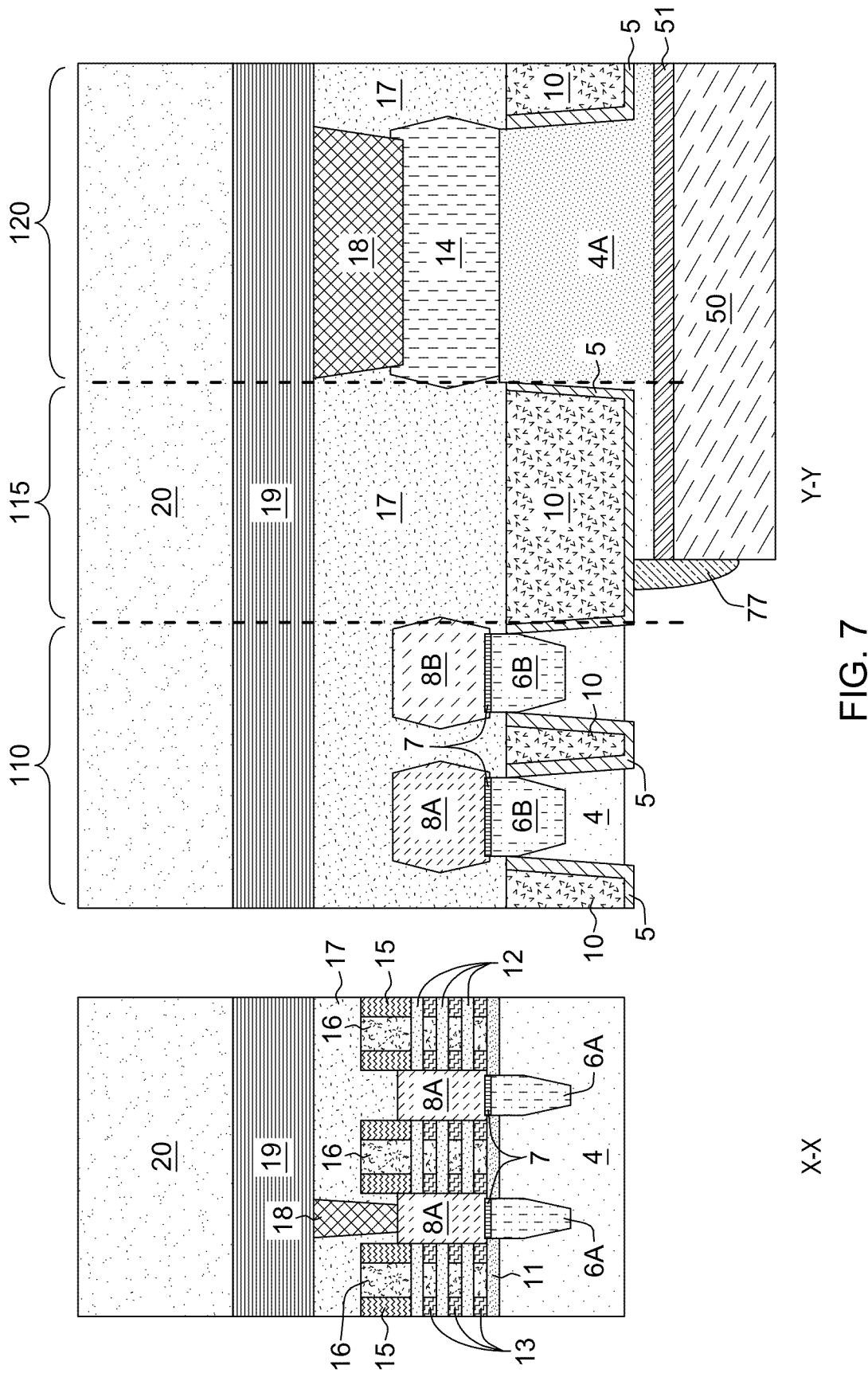
FIG. 7 depicts a cross-sectional view of the semiconductor structure after forming a spacer in the protected region contacting sidewalls of the OPL, the hardmask, and the silicon layer adjacent to the passive device n-well, in accordance with an embodiment of the present invention.

FIG. 7 depicts cross-sectional views of the semiconductor structure after forming spacer 77 contacting sidewalls of OPL 50, hardmask 51, and semiconductor 4 under hardmask 51, in accordance with an embodiment of the present invention. As depicted, cross-sectional view Y-Y of FIG. 7 includes the elements of cross-sectional view Y-Y of FIG. 6 with the addition of spacer 77. Cross-sectional view X-X of FIG. 7 is the same as cross-sectional view X-X of FIG. 6.

A spacer material such as but not limited to SiN or SiO, can be deposited, for example, by ALD. Spacer 77 can be formed with known spacer formation processes (e.g., using a reactive ion etch after spacer deposition). In FIG. 7, spacer 77 resides under liner 5 and on the sidewalls of semiconductor 4, hardmask 51, and on at least an upper portion of OPL 50. In an embodiment, spacer 77 directly abuts the sidewalls of semiconductor 4A, hardmask 51, and OPL 50. Spacer 77 can be formed under STI 10 contacting liner 5 in protected region 115. The thickness of spacer 77 directly abutting semiconductor 4 is approximately 3 nm to 20 nm but is not limited to these thicknesses.

Figure 8:
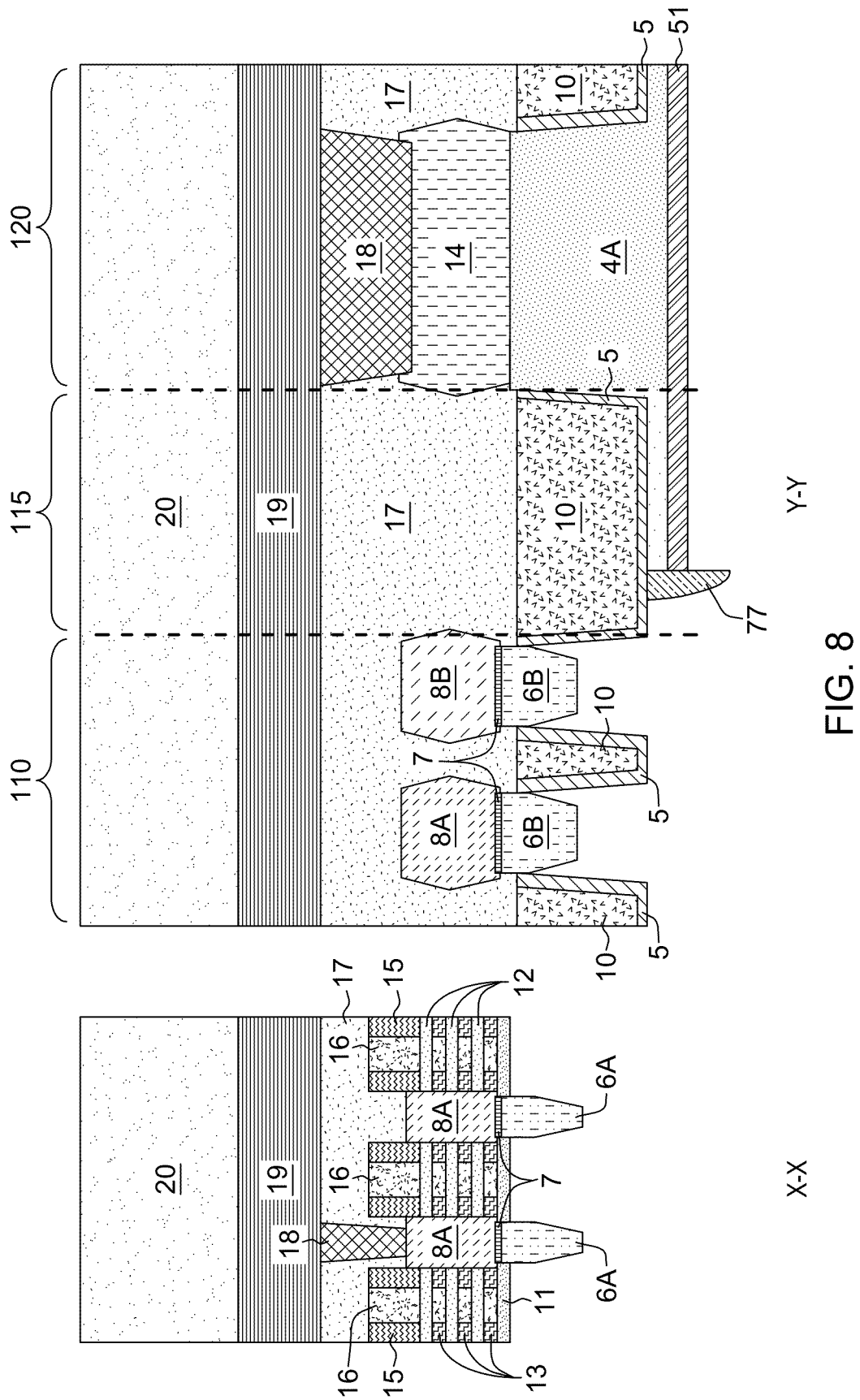
FIG. 8 depicts a cross-sectional view of the semiconductor structure after removing the remaining portion of the semiconductor layer and the OPL, in accordance with an embodiment of the present invention.

FIG. 8 depicts cross-sectional views of the semiconductor structure after removing the remaining portion of semiconductor 4 and OPL 50, in accordance with an embodiment of the present invention. As depicted, cross-sectional view X-X and cross-sectional view Y-Y of FIG. 8 include the same elements as the cross-sectional view X-X and cross-sectional view Y-Y of FIG. 7 without the portions of semiconductor 4 not covered by hardmask 51 and without OPL 50.

As depicted in FIG. 8, the exposed portions of semiconductor 4 can be selectively removed in cross-sectional view X-X and cross-sectional view Y-Y using one or more known semiconductor material etching processes. OPL 50 can be removed by one or more wet or dry etching processes. For example, a plasma ash can be used to remove OPL 50. One or more known dry or wet semiconductor etching processes can be used to remove the exposed portions of semiconductor 4 in active device region 110 and in an adjacent portion of protected region 115. The selected etching process and/or chemicals do not remove placeholders 6A, placeholders 6B, or any of the exposed dielectric materials (i.e., liner 5, BDI 11, hardmask 51, or spacer 77). After etching semiconductor 4, BDI 11, portions of placeholders 6A in cross-sectional view X-X are exposed. In cross-sectional view Y-Y, liner 5, placeholder 6B, hardmask 51, and spacer 77 can be exposed.

Figure 9:
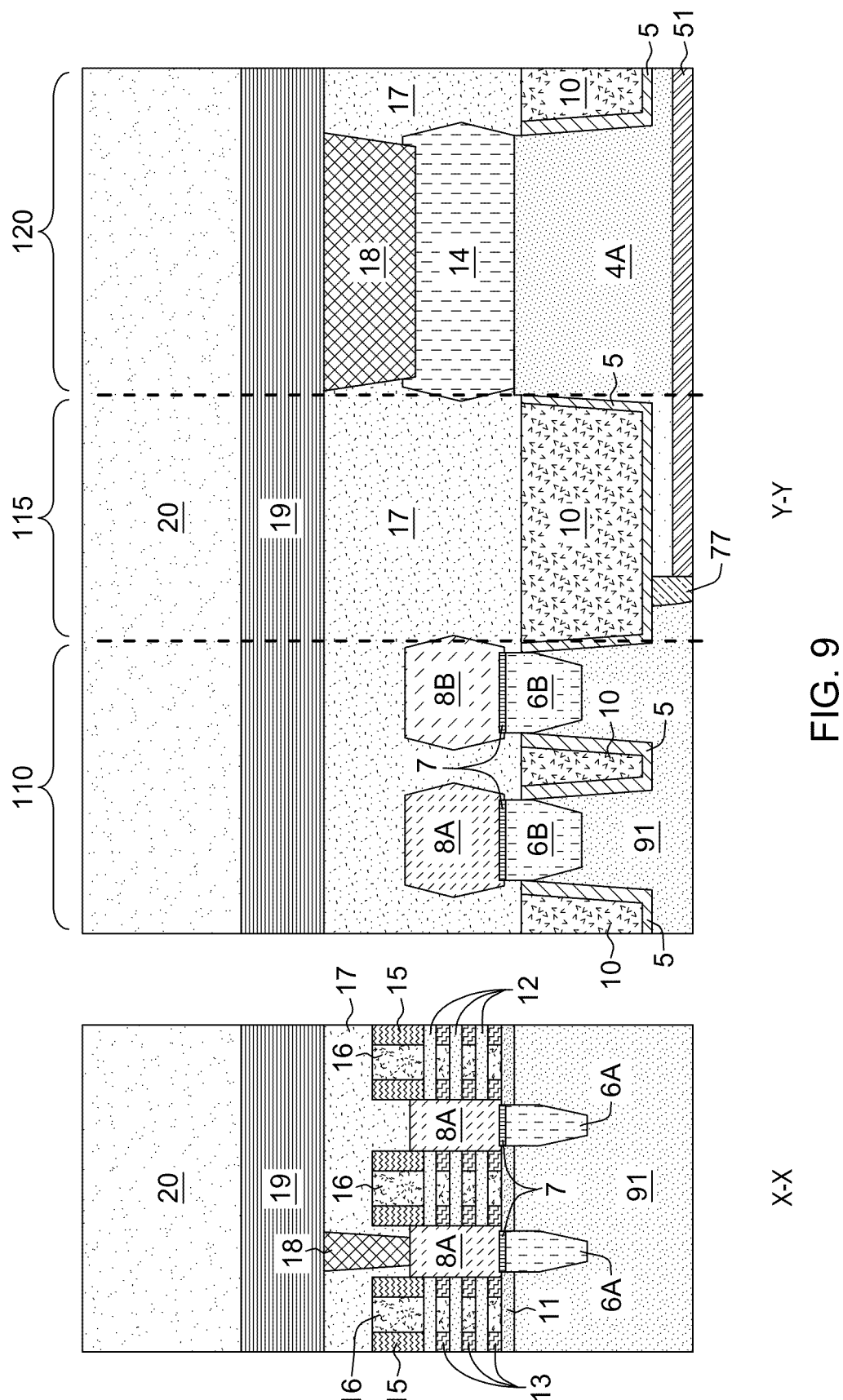
FIG. 9 depicts a cross-sectional view of the semiconductor structure after depositing a backside interlayer dielectric (BILD) and planarizing, in accordance with an embodiment of the present invention.

FIG. 9 depicts cross-sectional views of the semiconductor structure after depositing backside ILD (BILD) 91 and performing a chemical-mechanical polish (CMP), in accordance with an embodiment of the present invention. As depicted, cross-sectional view X-X and cross-sectional view Y-Y of FIG. 9 include the same elements as the cross-sectional view X-X and cross-sectional view Y-Y of FIG. 8 with the addition of BILD 91 and without a top portion of spacer 77.

Using a known material deposition process such as but not limited to a chemical vapor deposition (CVD) or ALD process, any known dielectric material used in a backside interlayer layer dielectric (BILD) can be deposited over the exposed surfaces depicted in FIG. 8. For example, in cross-sectional view X-X, BILD 91 deposits on exposed surfaces of BDI 11 and placeholders 6A. In protected region 115 and passive device region 120 of cross-sectional view Y-Y, BILD 91 deposits over liner 5, spacer 77, and hardmask 51. In active device region 110, BILD 91 deposited on the exposed surfaces of liner 5, and placeholders 6B. After performing the CMP to planarize the surface of the semiconductor structure depicted in FIG. 9, in cross-sectional view X-X, BILD 91 is exposed.

In cross-section view Y-Y, after the CMP, the surfaces of BILD 91, spacer 77, and hardmask 51 are exposed and leveled. The remaining portion of spacer 77 separates BILD 91 from semiconductor 4 under liner 5 and STI 10 in protected region 115. In this way, the remaining portion of spacer 77 can provide protection to semiconductor 4 in protected region 115 and semiconductor 4A.

Figure 10:
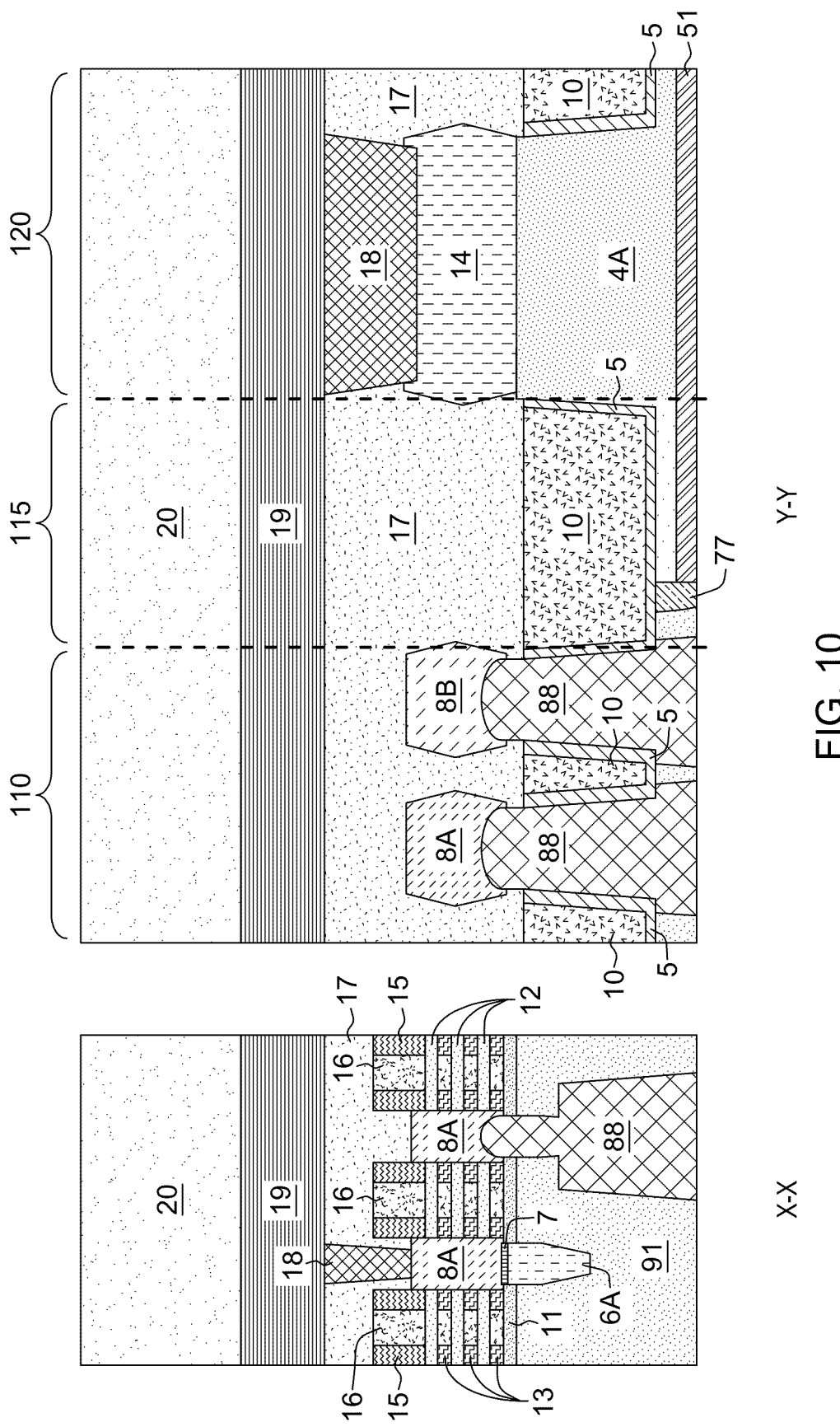
FIG. 10 depicts a cross-sectional view of the semiconductor structure after removing a placeholder material and forming backside contacts, in accordance with an embodiment of the present invention.

FIG. 10 depicts cross-sectional views of the semiconductor structure after patterning for backside contact formation, removing placeholders 6B and one of placeholders 6A, and forming backside contacts 88, in accordance with an embodiment of the present invention. As depicted, cross-sectional view X-X and cross-sectional view Y-Y of FIG. 10 include the same elements as the cross-sectional view X-X and cross-sectional view Y-Y of FIG. 9 without portions of BILD 91 and without the exposed placeholder 6A, placeholders 6B, and buffer 7 under the removed BILD 91 with backside contacts 88 added.

Using known lithography processes, the exposed surface of BILD 91 can be patterned for backside contact hole formation. Exposed portions of BILD 91 can be removed using one or more known wet or dry etching processes for removing the dielectric material of BILD 91.

One of placeholders 6A and buffer 7 in the cross-sectional view X-X and two placeholders 6B and buffer 7 in cross-sectional view Y-Y under the removed BILD 91 are also removed. Using known semiconductor material etching processes, the rightmost of placeholders 6A and both of placeholders 6B can be removed. In some cases, the etching process removes placeholders 6A and 6B includes a gouging of the source/drains. The gouging of the source/drains during etching of placeholders 6A and 6B in cross-sectional view Y-Y and the rightmost of placeholders 6A in cross-sectional view X-X removes buffer 7 and can remove a bottom portion of source/drain 8A and 8B in active device region 110 (e.g., the gouging depicted in FIG. 10 occurs on source/drain epi 8A and 8B in the cross-sectional view Y-Y and one of source/drain epi 8A in cross-sectional view X-X). In these cases where buffer 7 and the bottom portions of source/drain epi 8A and 8B are removed a rounded or crescent-like bottom portion of the gouged source/drain epi 8A and 8B can be removed during the etching process. In another example (not depicted), little to none of buffer 7 and source/drain epi 8A and 8B in active device region 110 are removed during placeholder 6A and 6B etch. In these cases, the bottom surface of buffer 7 under source/drain epi 8A and 8B is essentially flat. In some cases, buffer 7 remains and in another example, buffer 7 is removed and source/drain epi 8A and 8B remain intact. Wet etch or dry etch was used to remove the semiconductor material of placeholder 6A, placeholder 6B, and in some cases, buffer 7 and portions of source/drain epi 8A and 8B, the remaining portion of spacer 77 prevents the undercut of semiconductor 4 directly contacting the well, labeled semiconductor 4A, of passive device 14.

Providing spacer 77 to protect semiconductor 4 adjacent to semiconductor 4A allows for a shorter distance between passive device 14 and the active devices depicted in active device region 110 (e.g., protected region 115 can be smaller). In some embodiments, spacer 77 contact the left-most edge of semiconductor 4A. In these embodiments, spacer 77 contacts semiconductor 4A (e.g., the well of passive device 14) BILD 91, liner 5, and hardmask 51 but does not contact semiconductor 4. In this embodiment, STI 10 above spacer 77 can have a reduced horizontal width. For example, STI 10 in the protected region has less than one half of the width of the depicted STI 19 in protected region 115 and the STI in protected region can have a width as narrow as 15 to 50 nm. Reducing the width of STI 10 in protected region can reduce the size of protected region 115. This reduction can decrease the distance between active device region 110 and passive device region 120 and can result in a smaller semiconductor chip or semiconductor chip footprint.

As depicted in FIG. 10, providing spacer 77 prevents undercutting of semiconductor 4 during placeholders 6A and 6B etching. During the etching process, semiconductor 4 in protected region 115 is protected by the dielectric material of STI 10 with liner 5, the dielectric material of spacer 77, the dielectric material of hardmask 51, and the dielectric material of BILD 91.

After removing BILD 91, buffer 7, and the exposed placeholders 6A and 6B, a contact metal such as but not limited to copper or tungsten can be deposited using CVD, ALD, or another known metal or metal alloy deposition process for forming semiconductor backside contacts 88 to source/drain epi 8A of the nanosheet GAA FET devices in FIG. 11. After depositing the contact metal for backside contacts 88, a CMP removes excess contact metal.

FIG. 11 depicts cross-sectional views of the semiconductor structure after forming BPR 111 and forming backside interconnect wiring for a backside power delivery network (BSPDN) 114, in accordance with an embodiment of the present invention. As depicted, cross-sectional view X-X and cross-sectional view Y-Y of FIG. 11 include the same elements as the cross-sectional view X-X and cross-sectional view Y-Y of FIG. 10 with buried power rail (BPR) 111 and BSPDN 114.

Three nanosheet GAA FET devices are depicted in the cross-sectional view X-X of FIG. 11 along with backside contact 88 connecting the nanosheet GAA FET devices to BPR 111 and BSPDN 114. Cross-sectional view X-X in active device region 110 cuts through gates 16 of the nanosheet GAA FET devices. As depicted, each of the nanosheet GAA FET devices is composed of channels 12, source/drain epi 8A, and gates 16 with spacer 15 and inner spacers 13. As depicted in cross-sectional view X-X, each of the nanosheet GAA FET devices connect by contact 18 to frontside interconnect wiring 19 and by backside contact 88 to BPR 111.

As depicted in FIG. 11, spacer 77 in the cross-sectional view Y-Y is perpendicular to gates 16 and parallel to the location of cross-sectional view X-X depicted in FIG. 1. In cross-sectional view Y-Y of FIG. 11, passive device 14 connects by contact 18 to frontside interconnect wiring 19. As previously discussed, passive device 14 includes semiconductor 4A as the doped passive device well. As depicted in FIG. 11, passive device 14 is separated and electrically isolated from the closest logic device (i.e., the closest nanosheet GAA FET device in active device region 110) by spacer 77, BILD 91, STI 10, and ILD 17. Carrier wafer 20 can be bonded and connected to frontside interconnect wiring 19.

A layer of a conductive metal or metal alloy such as but not limited to copper can be deposited using known deposition processes such as CVD on the exposed surfaces of backside contacts 88 (depicted in cross-sectional view X-X), BILD 91, spacer 77, and hardmask 51. A CMP can planarize BPR 111. Using known BEOL processes, a plurality of metal and dielectric material layers are deposited and personalized to create the lines, planes, landing pads, and vias forming BSPDN 114.

Spacer 77, as depicted in the cross-sectional view Y-Y of FIG. 11, contacts a portion of liner 5, BPR 111, a sidewall of a portion of BILD 91, a sidewall of hardmask 51 that is over BPR 111, and a sidewall of semiconductor 4. Hardmask 51 electrically isolates semiconductor 4 and semiconductor 4A from BPR 111. As depicted in FIG. 11, BSPDN 114 is under and contacting BPR 111, where BPR 111 contacts a bottom surface of hardmask 51, spacer 77, BILD 91, and backside contacts 88 (backside contacts 88 depicted in cross-sectional view X-X). Additionally, FIG. 11 depicts passive device 14 with semiconductor 4A contacting semiconductor 4 and adjacent to STI 10 in protected region 115. STI 10 in protected region 115 is depicted between passive device 14 and the closest active device (i.e., the rightmost nanosheet GAA FET device in cross-sectional view X-X) in active device region 110.

As depicted in cross-sectional view Y-Y of FIG. 11, protected region 115 includes spacer 77 and a portion of hardmask 51 in addition to portions of carrier wafer 20, frontside interconnect wiring 19, ILD 17, STI 10 with liner 5, BILD 91, semiconductor 4, hardmask 51, BPR 111, and BSPDN 114. In some examples, protected region 115 may include a small portion of semiconductor 4A. As previously discussed, in other examples, different semiconductor devices and a different number of semiconductor devices may reside in active device region 110, protected region 115, and passive device region 120.

Spacer 77 in protected region 115 is under STI 10 and protects the well of passive device 14 (i.e., semiconductor 4A) from undercutting of the semiconductor material during backside contact 88 formation. Spacer 77 can be parallel to one or more passive devices in passive device region 120 and parallel protected region 115. Spacer 77 can prevent semiconductor 4 undercut during backside contact 88 formation and, in this way, prevent the undercut of the passive device well (i.e., semiconductor 4A). In some embodiments, spacer 77 contacts the sidewall of semiconductor 4A, the well of the passive device, the sidewall of BILD 91, the sidewall of hardmask 51, BPR 111, and is under STI 10 in protected region 115 between passive device 14 and an active device (e.g., a nanosheet GAA FET device) in active device region 110. Spacer 77 can reduce the distance required between the closest active device in active device region 110 and passive device 14, which is closest to active device region 110 depicted in FIG. 11. In this way, spacer 77 may reduce the footprint of a semiconductor chip. The addition of spacer 77 as depicted in FIG. 11 can reduce the space needed between active device region 110 and passive device region 120. The addition of spacer 77 may also improve semiconductor device or semiconductor chip performance by reducing the undercut of semiconductor 4A in passive device region 120. Spacer 77 protects the well of passive device 14 during semiconductor material etching processes for backside contact formation. The vertical sidewalls of spacer 77 protect semiconductor 4 under STI 10 in protected region 115. The sidewalls of spacer 77 along with STI 10 and hardmask 51 prevent any etching or undercut of semiconductor 4 under STI 10 in protected region 115 and in doing so, protects semiconductor 4A directly adjacent contacting the portion of semiconductor 4 in protected region 115.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The invention claimed is:

1. A semiconductor structure comprising:
   a spacer directly contacting a hardmask material and a portion of a semiconductor material on a portion of the hardmask material, wherein the spacer resides below a shallow trench isolation between a passive device and an active device.

2. The semiconductor structure of claim 1, wherein the spacer contacts a liner surrounding the shallow trench isolation and a backside power rail.

3. The semiconductor structure of claim 2, wherein the spacer directly contacts the portion of the semiconductor material on the portion of the hardmask material, the hardmask material, the liner surrounding the shallow trench isolation, and the backside power rail, wherein the portion of the semiconductor material on the portion of the hardmask contacts a well of the passive device.

4. The semiconductor structure of claim 2, further comprising:
   the backside power rail contacting a bottom surface of the hardmask, the spacer, a backside interlayer dielectric, and one or more backside contacts; and
   a backside power delivery network contacting the backside power rail.

5. The semiconductor structure of claim 2, wherein the portion of a semiconductor material on the hardmask has a sidewall contacting the spacer, and wherein the semiconductor material on the portion of the hardmask material is not undercut.

6. The semiconductor structure of claim 1, wherein the active device is one of a plurality of active devices in an active device region, and wherein the active device is a closest active device of the plurality active devices to the passive device.

7. The semiconductor structure of claim 6, wherein the passive device is one of one or more passive devices in a passive device region, and wherein the passive device is a closest passive device of the one or more passive devices to the active device.

8. The semiconductor structure of claim 7, wherein the spacer resides under the shallow trench isolation that is between the active device in the active device region and the passive device in the passive device region.

9. The semiconductor structure of claim 6, wherein the spacer is perpendicular to one or more gates of the plurality of active devices.

10. The semiconductor structure of claim 1, wherein the active device is a nanosheet gate-all-around field-effect transistor (GAA FET) device.

11. The semiconductor structure of claim 1, wherein the active device is a semiconductor device selected from the group consisting of a finFET device, a static random-access memory device, a complementary field-effect transistor device, a GAA FET device, a NAND flash memory device, and a NOR flash memory device.

12. The semiconductor structure of claim 1, wherein the passive device is a semiconductor device selected from the group consisting of a diode, an electrostatic discharge (ESD) diode, and a bipolar transistor.

13. The semiconductor structure of claim 2, wherein the spacer resides below and contacts the shallow trench isolation resides in a protected region that is between the active device region and a passive device region with the passive device.

* * * * *